United States Patent [19]

Takaya

[11] Patent Number: 5,031,222

[45] Date of Patent: Jul. 9, 1991

[54] PIEZOELECTRIC SPEAKER

[75] Inventor: Tadashi Takaya, Kyoto, Japan

[73] Assignee: Murata Manufacturing Co., Ltd., Nagaokakyo, Japan

[21] Appl. No.: 552,650

[22] Filed: Jul. 12, 1990

Related U.S. Application Data

[63] Continuation of Ser. No. 366,087, Jun. 15, 1989, abandoned.

[30] Foreign Application Priority Data

Jul. 22, 1988 [JP] Japan ................................ 63-184399
Jul. 29, 1988 [JP] Japan ................................ 63-191102

[51] Int. Cl.[5] ........................ H04R 25/00; H01L 41/04

[52] U.S. Cl. .................................... 381/190; 381/173; 381/186; 310/324

[58] Field of Search ............... 381/190, 173, 186, 203, 381/152; 310/322, 324

[56] References Cited

U.S. PATENT DOCUMENTS

| | | | |
|---|---|---|---|
| 2,411,146 | 11/1946 | Clement | 381/173 |
| 2,911,484 | 11/1959 | Spitzer et al. | 381/186 |
| 4,430,529 | 2/1984 | Nakagawa et al. | 381/190 |
| 4,751,419 | 6/1988 | Takahata | 310/322 |
| 4,807,294 | 2/1989 | Iwata et al. | 381/188 |

FOREIGN PATENT DOCUMENTS

| | | | |
|---|---|---|---|
| 0200342 | 4/1983 | Fed. Rep. of Germany | 381/190 |
| 128900 | 7/1984 | Japan | 381/190 |

*Primary Examiner*—Jin F. Ng
*Assistant Examiner*—Jason Chan
*Attorney, Agent, or Firm*—Armstrong, Nikaido, Marmelstein, Kubovcik, & Murray

[57] ABSTRACT

A piezoelectric speaker which generates sound by vibrating a plane diaphragm using a plurality of piezoelectric drivers is disclosed. The diaphragm is formed of resin foam plates and the piezoelectric drivers are contained therein while being interposed and supported at the centers thereof. The piezoelectric drivers are divided into at least two groups which have different primary resonance frequencies.

8 Claims, 5 Drawing Sheets

PIEZOELECTRIC SPEAKER

This application is a continuation of application Ser. No. 366,087 filed June 15, 1989, now abandoned.

BACKGROUND OF THE INVENTION (1) Field of the Invention

This invention relates speaker and, more particularly to a piezoelectric speaker which generates sound by vibrating a diaphragm using piezoelectric drivers.

(2) Description of the Prior Art

A conventional piezoelectric speaker has a construction in which a vibrating film is stretched on a frame while being applied tension and a plurality of piezoelectric drivers are directly stuck on the film.

According to this conventional technique, although a plane speaker having a large surface area can be obtained, there has been room for improvement because its frequency characteristic is not so excellent.

SUMMARY OF THE INVENTION

A primary object of the present invention, therefore, is to provide a rational piezoelectric speaker having an improved frequency characteristic.

Another object of the present invention is to provide a piezoelectric speaker having high sound quality by preventing primary resonance of the diaphragm.

The above objects are fulfilled, according to the present invention, by a piezoelectric speaker which generates sound by vibrating a diaphragm using piezoelectric drivers, comprising; a plurality of piezoelectric drivers divided into at least two groups which have different primary resonance frequencies, each piezoelectric driver being vibrated in a bending mode by piezoelectric effect, a diaphragm which is made of resin foam and has a plurality of spaces bigger than the piezoelectric drivers, each space containing one piezoelectric driver, piezoelectric supporting means for supporting the center of the piezoelectric driver contained in the space, and a frame for supporting the diaphragm without restricting its vibration.

The diaphragm may have a construction in which two resin foam plates, each having a plurality of recesses on one side, are assembled in such a manner that the recesses in one plate are opposed to the recesses in the other plate.

The piezoelectric driver supporting means may be a plurality of opposed projecting members formed on the recess bottoms of the two resin foam plates, each opposed pair of the projecting members interposing and supporting the piezoelectric driver.

The projecting members may be integrally formed on the resin foam plates.

Some of the piezoelectric drivers may have their primary resonance frequencies between the primary resonance frequency and the secondary resonance frequency of one of the other piezoelectric drivers.

Some of the piezoelectric drivers may be provided at nodes in the primary resonance mode of the natural vibration of the diaphragm, the nodes being determined by vibrating the diaphragm using one of the other piezoelectric drivers.

The piezoelectric driver provided for determining the nodes of the primary resonance mode of the diaphragm is selected from the group having the lowest primary resonance frequency.

The piezoelectric drivers provided at the nodes of the primary resonance mode of the diaphragm are selected from the group having the lowest primary resonance frequency.

According to the present invention, at least two groups of piezoelectric drivers which have different primary resonance frequencies are provided so that the primary resonance frequency of one group has a value between the primary resonance frequency and secondary resonance frequency of the other group. Therefore, even in a frequency range in which a sound pressure level drops when only the latter group of piezoelectric drivers are employed, the sound pressure level is compensated for by the former group of piezoelectric drivers. This leads to a flat sound pressure level as a whole from a low frequency range to a high frequency range.

In the above construction, if some of the piezoelectric drivers are provided at nodes in the primary resonance mode of the natural vibration of the diaphragm, the nodes are vibrated along with other portions, whereby the whole diaphragm is vibrated. As a result, a piezoelectric speaker having a flat sound pressure level over a wide frequency range and having a high sound quality can be obtained.

BRIEF DESCRIPTION OF THE DRAWINGS

These and other objects, advantages and features of the invention will become apparent from the following description thereof taken in conjunction with the accompanying drawings which illustrates a specific embodiment of the invention. In the drawings.

DESCRIPTION OF THE PREFERRED EMBODIMENTS

Figure 1:
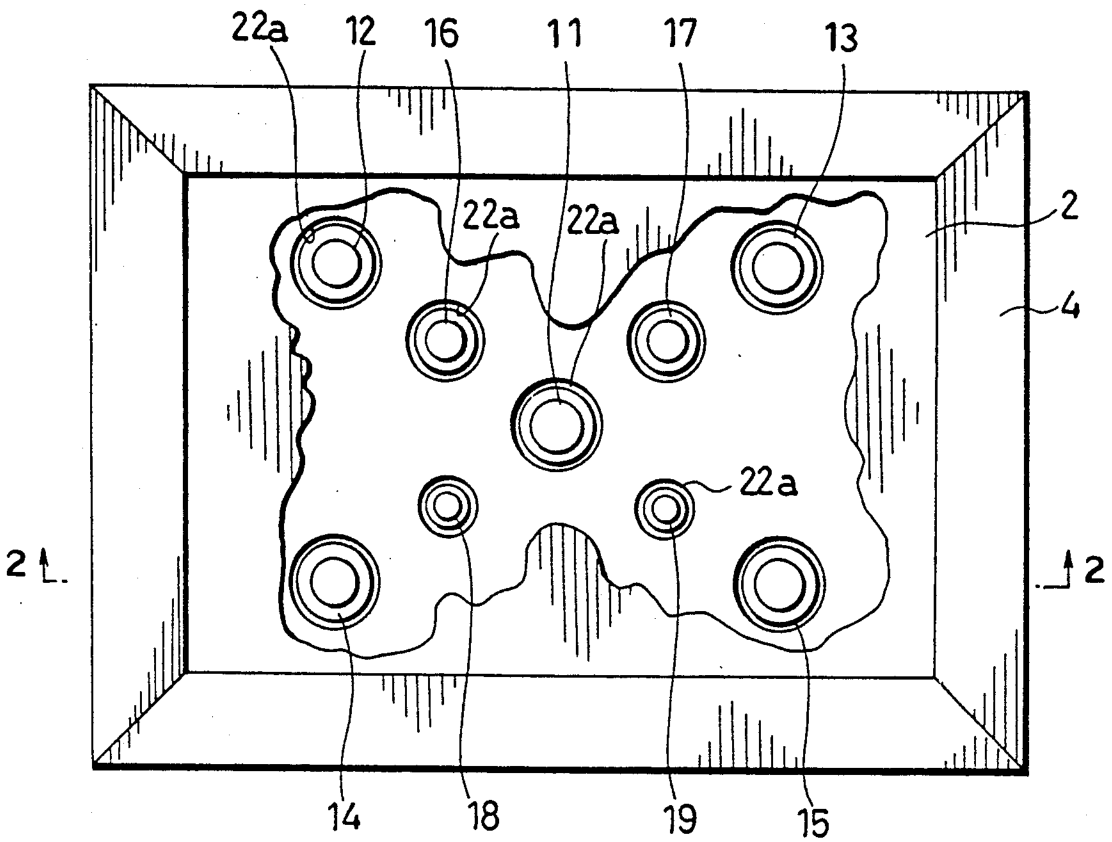
FIG. 1 is a partially broken front view showing an embodiment of the present invention.
Figure 2:
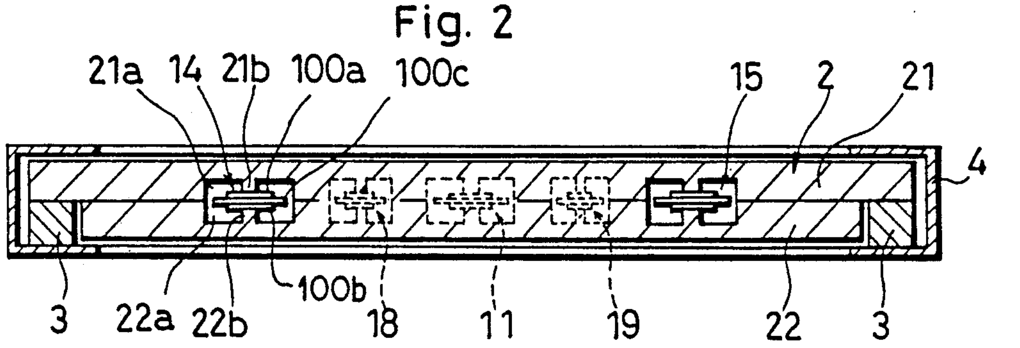
FIG. 2 is a cross section taken on line II—II of FIG. 1.

FIG. 1 is a partially broken front view of a piezoelectric speaker as an embodiment of the present invention and FIG. 2 is a cross section taken on line II—II of FIG. 1. This piezoelectric speaker has a construction wherein a diaphragm 2 containing a plurality of piezoelectric drivers 11-19 is fixed to a frame 4 through an elastic supporting member 3.

The frame 4 is made of a metal plate such as aluminum, and has a squared gutter all along its inner wall. The outer periphery of the diaphragm 2 and the elastic supporting member 3 are inserted into this gutter.

The elastic supporting member 3 is a long, narrow tape made of a resin foam such as urethane foam or polyethylene foam or of rubber foam, and is stuck on the inner wall of the frame without any gap, using a kind of double-sided adhesive tape.

Figure 3:
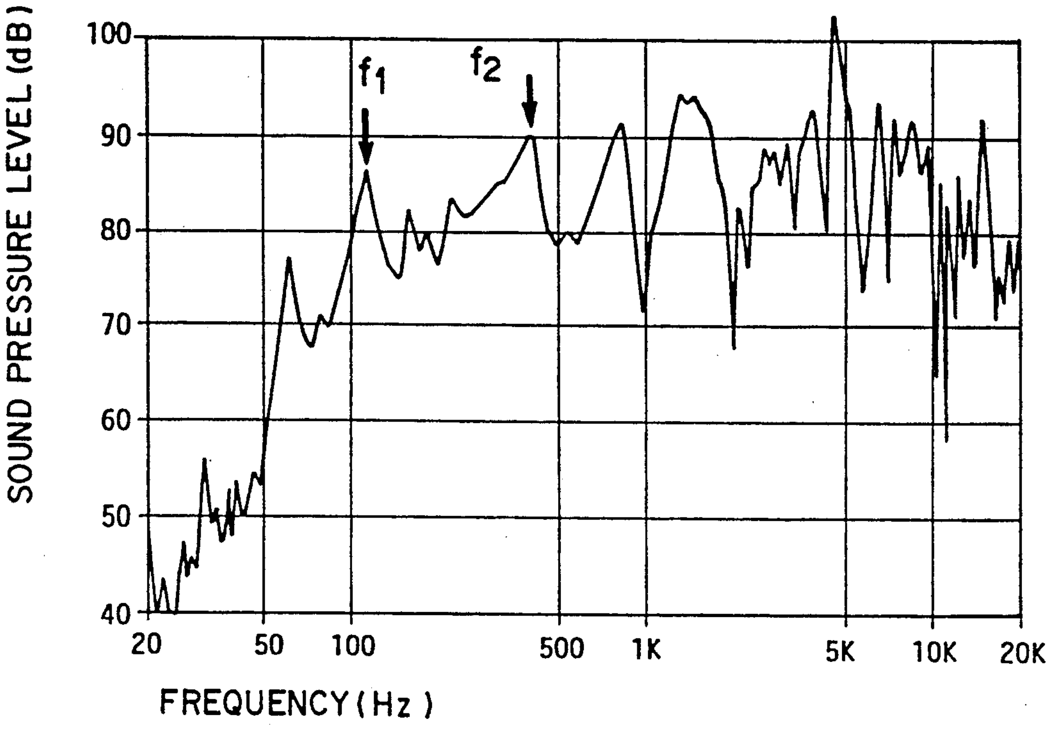
FIG. 3 is a graph showing a frequency characteristic of a piezoelectric driver having a diameter of 80ϕ.

Each of the piezoelectric drivers 11–19 is of the bimorph type, which has two piezoelectric plates 100*a* and 100*b*, made of PZT or the like, interposing a metal plate 100*c*. When electric signals are applied to both piezoelectric plates 100*a* and 100*b*, the whole piezoelectric driver including the metal plate 100*c* is vibrated by piezoelectric effect. In this embodiment, the piezoelectric drivers 11–19 are divided into three groups which have different primary resonance frequencies. The piezoelectric drivers 16–19 of the second and third groups have their primary resonance frequencies f1 between the primary resonance frequency f1 and the secondary resonance frequency f2 of the first group. The piezoelectric drivers 11–15 of the first group have low primary resonance frequencies in order to improve a sound pressure level in a low frequency range. The primary resonance frequency of the piezoelectric driver and its diameter have a relationship that the larger the diameter is, the lower the primary resonance frequency is. In this embodiment, the piezoelectric drivers of the first group have diameters of 80ϕ. The sound pressure level —frequency characteristic of this type piezoelectric driver is shown in FIG. 3. As seen from FIG. 3, f1=110Hz and f2=450Hz.

Figure 4:
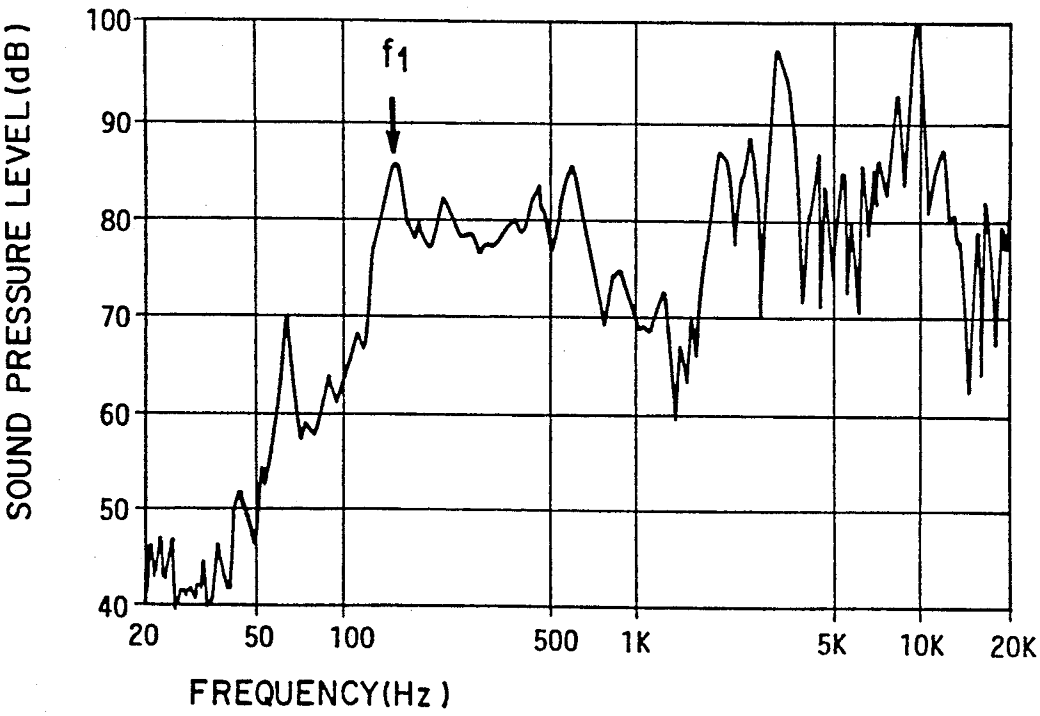
FIG. 4 is a graph showing a frequency characteristic of a piezoelectric driver having a diameter of 70ϕ.
Figure 5:
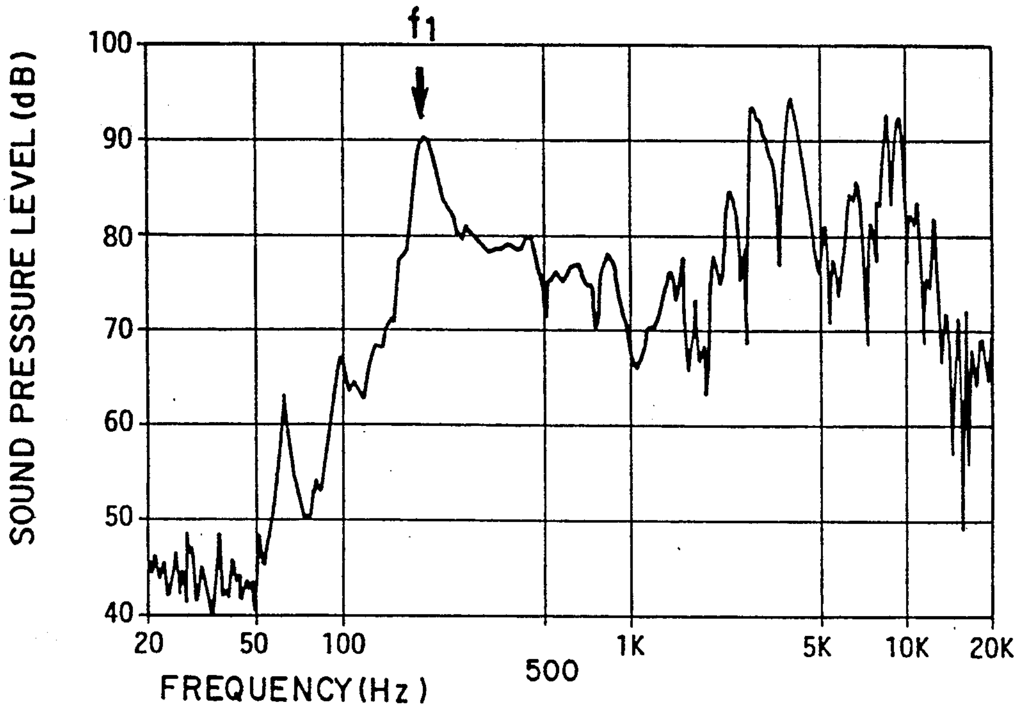
FIG. 5 is a graph showing a frequency characteristic of a piezoelectric driver having a diameter of 60ϕ.

The piezoelectric drivers 16 and 17 of the second group have diameters of 70ϕ and the piezoelectric drivers 18 and 19 of the third group have diameters of 60ϕ, respectively, so that their primary resonance frequencies are between the above f1 and f2. FIG. 4 and FIG. 5 show the frequency characteristics of the piezoelectric drivers having a diameter of 70ϕ (the second group) and 60ϕ (the third group), respectively. As seen from these figures, the primary resonance frequency f1 of the piezoelectric driver having a diameter of 70ϕ is 150Hz, and of the piezoelectric driver having a diameter of 60ϕ is 200Hz. This means that both of their primary resonance frequencies are between the primary resonance frequency and the secondary resonance frequency of the first group.

Figure 6:
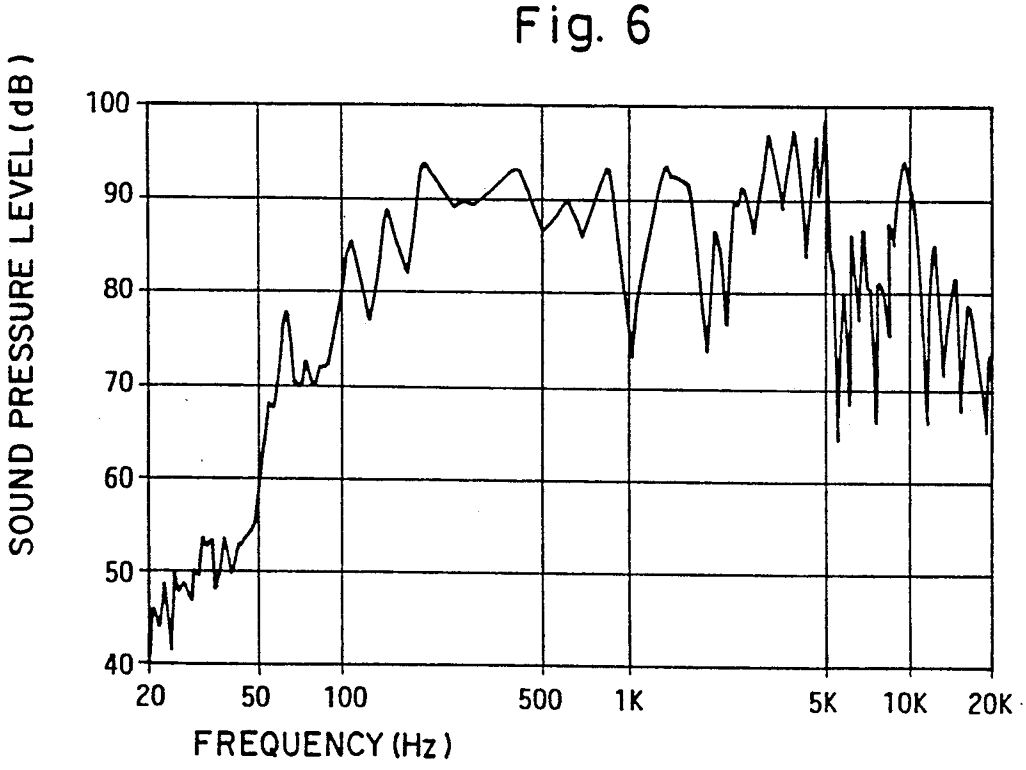
FIG. 6 is a graph showing an overall frequency characteristic obtained by theoretically composing the frequency characteristics of all the piezoelectric drivers.

FIG. 6 shows an overall frequency characteristic obtained by theoretically composing the frequency characteristics of the above three groups.

In each group, any number of piezoelectric drivers may be employed. In this embodiment, nine piezoelectric drivers are employed as a whole and the first group comprises five piezoelectric drivers, the second group two and the third group two. How to arrange the piezoelectric drivers will be explained next along with the explanation of the diaphragm 2.

The diaphragm 2 is produced by assembling two opposed resin foam plates 21 and 22 of different sizes, each of which has a recess 21*a* or 22*a* and a projecting member 21*b* and 22*b*. The recess 21*a* and 22*a* make a space somewhat bigger than the piezoelectric driver when the two resin foam plates 21 and 22 are assembled, and the projecting members 21*b* and 22*b* are integrally formed at the substantial centers of the bottoms of the recesses 21*a* and 22*a*, respectively. Each of the piezoelectric drivers 11–19 is accommodated in a space made of the recesses 21*a* and 22*a* while being interposed and supported by the projecting members 21*b* and 22*b*.

Figure 7:
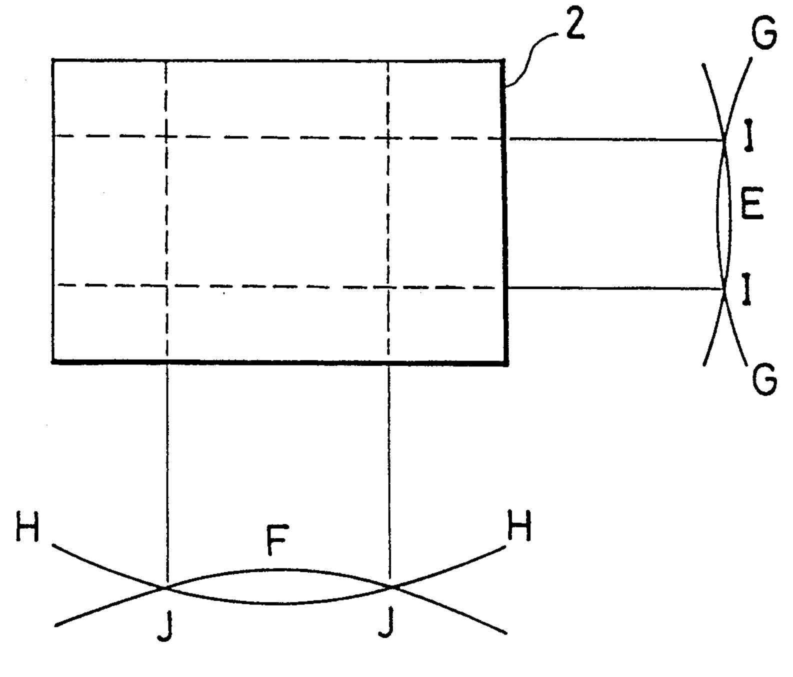
FIG. 7 is an explanatory view showing how to determine the arrangement of the piezoelectric drivers of a first group.

The recesses 21*a*, 22*a* are formed on the resin foam plates substantially along its diagonal lines as seen from the front side in FIG. 1. The accurate positions at which the recesses are to be formed and the piezoelectric drivers of which group are provided in which recesses are determined as follows. First, the piezoelectric drivers of the first group are provided at the center and in the vicinity of four corners of the resin foam plate. In this case, the four piezoelectric drivers except the one positioned at the center are provided at nodes in the primary resonance mode of the natural vibration of the diaphragm. The above nodes are determined by vibrating the diaphragm provided with one piezoelectric driver at the center thereof. More particularly, when only one piezoelectric driver is provided at the center of the resin foam plate, the primary resonance of the resin foam plate occurs in the vertical and horizontal directions as shown in FIG. 7. At this time, the vibrations in both directions respectively have nodes I and J between the center E and the ends G, and between the center F and the ends H. At both sides of these nodes I and J, the diaphragm 2 is locally vibrated. In order to practically prevent the local vibration, the four piezoelectric drivers are provided at the intersecting points of the nodes, I and the nodes J.

Next, as shown in FIG. 1, the piezoelectric drivers 16 and 17 of the second group are provided between the piezoelectric drivers 11 and 12, and between the piezoelectric drivers 11 and 13, respectively. The piezoelectric drivers 18 and 19 of the third group are provided between the piezoelectric drivers 11 and 14, and between the piezoelectric drivers 11 and 15, respectively.

Figure 8:
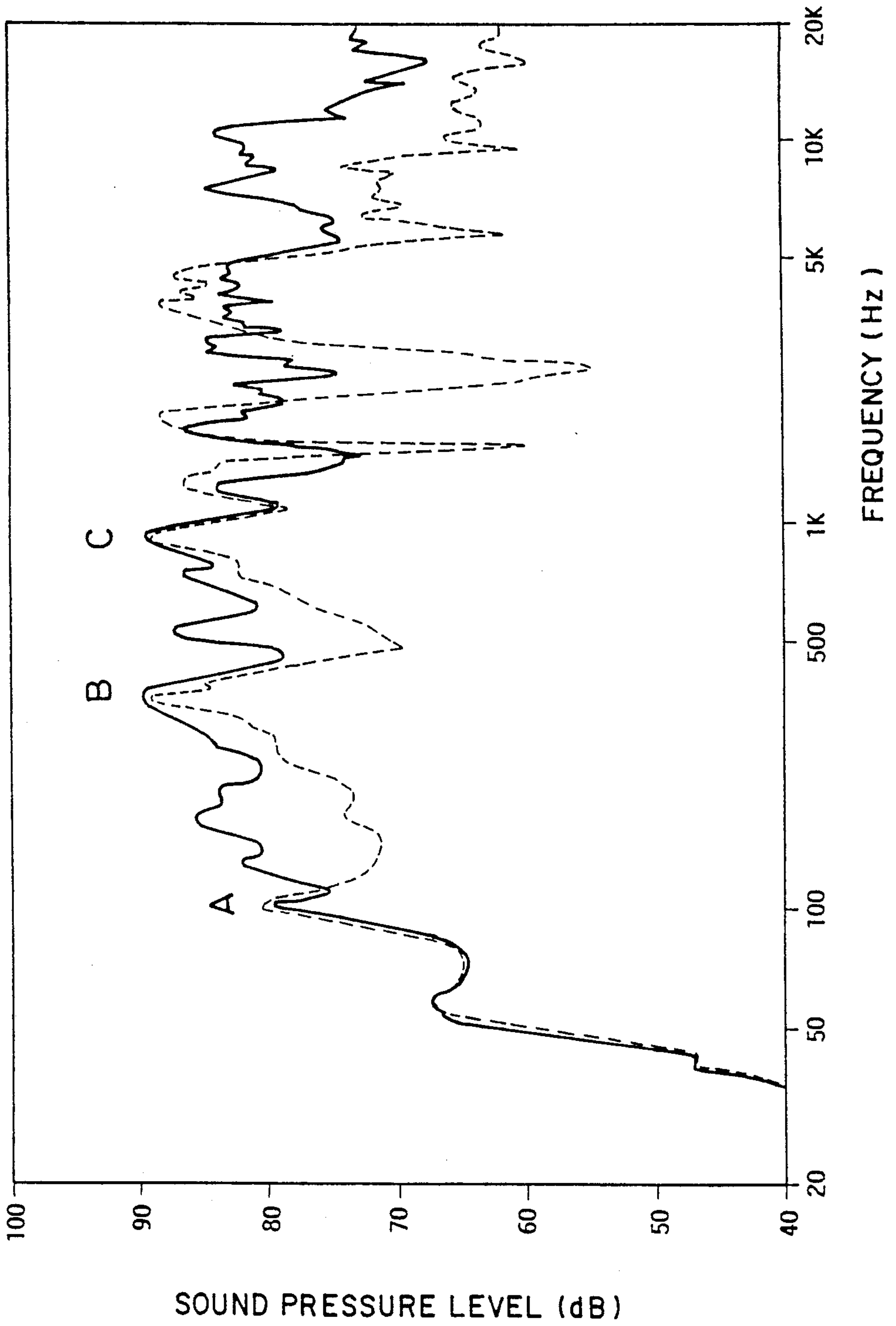
FIG. 8 is a view showing a frequency characteristic of a diaphragm.

The solid line in FIG. 8 shows the frequency characteristic of the diaphragm having the above construction wherein the frame 4 has a width of 728 mm, a height of 18 mm and a depth of 29 mm, and the resin foam plate has a width of 704 mm, a height of 490 mm and a depth of 18 mm, and wherein nine piezoelectric drivers are employed. The dashed line in the same figure shows the frequency characteristic of the diaphragm having the same construction as above except that the second and third groups of piezoelectric drivers are not employed. As apparent from these figures, the piezoelectric speaker of the present invention has the sound pressure peaks of the second and third groups between the primary resonance frequency A and the secondary resonance frequency B of the first group. As a result, the sound pressure level is prevented from dropping between the primary resonance frequency and the secondary resonance frequency of the first group. This improves the frequency characteristic in the low frequency range. Further, between the secondary resonance frequency B and the tertiary resonance frequency C, and between the higher resonance frequencies, the sound pressure level is kept flat, whereby the sound quality is improved over the whole frequency range.

Although the piezoelectric driver is of the bimorph type in the above embodiment, also can be employed a piezoelectric driver of the unimorph type in which a piezoelectric plate is stuck on only one side of a metal plate.

Figure 9:
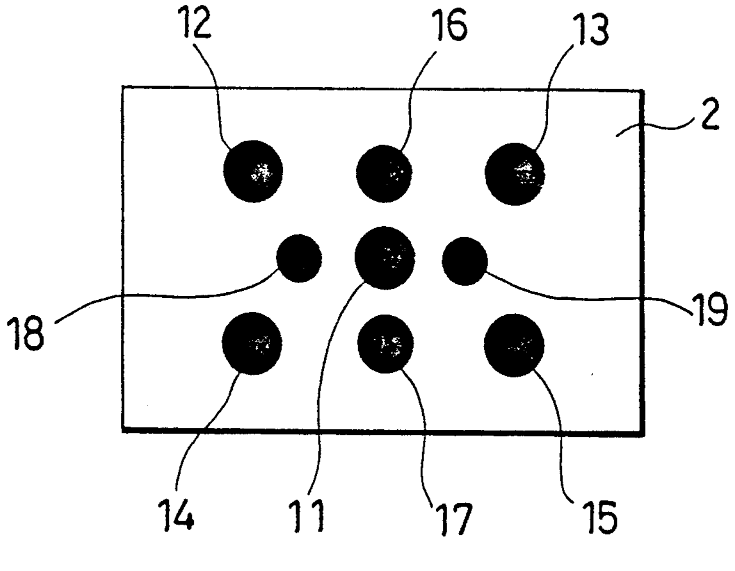
FIG. 9 is a view showing another arrangement of the piezoelectric drivers as another embodiment of the present invention.

Arrangement of the piezoelectric drivers is not limited to that described in the above embodiment but may be determined appropriately. FIG. 9 shows a preferable example as another arrangement. In FIG. 9, although the piezoelectric drivers of the first group are positioned in the same manner as in FIG. 1, the piezoelectric drivers 16 and 17 of the second group are respectively provided at the centers of the lines between the piezoelectric drivers 12 and 13 and between the piezoelectric drivers 14 and 15. The piezoelectric drivers 18 and 19 of the third group are respectively provided in the triangles having as their apexes the piezoelectric drivers 11, 12 and 14, and 11, 13 and 15.

In the above embodiment, the diaphragm is produced by assembling two resin foam plates having different sizes. The diaphragm may comprise two same-sized resin foam plates or a single resin foam plate.

Although the diaphragm has a square shape in the above embodiment, it may have a circular shape or any other shape.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A piezoelectric speaker which generates sound by vibrating a diaphragm using piezoelectric drivers, comprising:

- a plurality of piezoelectric drivers divided into at least two groups which have different primary resonance frequencies, each piezoelectric driver being vibrated in bending mode by piezoelectric effect;
- a diaphragm which is made of resin foam and has a plurality of spaces defined thereon bigger than the piezoelectric drivers, each space containing one of each said piezoelectric driver;
- piezoelectric supporting means for supporting only the center of each said piezoelectric driver contained in said space; and
- a frame for supporting said diaphragm without restricting its vibration.

2. A piezoelectric speaker as claimed in claim 1, wherein said diaphragm has a construction in which two resin foam plates, each having a plurality of recesses on one side, are assembled in such a manner that the recesses in one plate are opposed to the recesses in the other plate.

3. A piezoelectric speaker as claimed in claim 1, wherein said piezoelectric driver supporting means are a plurality of opposed projecting members formed on the recess bottoms of the two resin foam plates, each opposed pair of the projecting members interposing and supporting said piezoelectric driver.

4. A piezoelectric speaker as claimed in claim 3, wherein said projecting members are integrally formed on the resin foam plates.

5. A piezoelectric speaker as claimed in claim 1, wherein a predetermined number of said piezoelectric drivers have their primary resonance frequencies between the primary resonance frequency and the secondary resonance frequency of one of other piezoelectric drivers.

6. A piezoelectric speaker as claimed in claim 1, wherein a predetermined number of said piezoelectric drivers are provided at nodes in the primary resonance mode of the natural vibration of the diaphragm, said nodes being determined by vibrating the diaphragm using one of other piezoelectric drivers.

7. A piezoelectric speaker as claimed in claim 6, wherein the piezoelectric driver provided for determining the nodes of the primary resonance mode of the diaphragm is selected from the group having the lowest primary resonance frequency.

8. A piezoelectric speaker as claimed in claim 6, wherein the piezoelectric drivers provided at the nodes of the primary resonance mode of the diaphragm are selected from the group having the lowest primary resonance frequency.

* * * * *